United States Patent [19]
Shiralagi

[11] Patent Number: 6,043,143
[45] Date of Patent: Mar. 28, 2000

[54] OHMIC CONTACT AND METHOD OF MANUFACTURE

[75] Inventor: Kumar Shiralagi, Chandler, Ariz.

[73] Assignee: Motorola, Inc., Schaumburg, Ill.

[21] Appl. No.: 09/072,197

[22] Filed: May 4, 1998

[51] Int. Cl.[7] .......................... H01L 21/28; H01L 21/3205
[52] U.S. Cl. .......................... 438/602; 438/518; 438/519; 438/606; 438/933; 438/934; 438/938
[58] Field of Search ..................... 438/602, 606, 438/518, 519, 933, 934, 938

Primary Examiner—John F. Niebling
Assistant Examiner—David A Zarneke
Attorney, Agent, or Firm—Rennie William Dover

[57] ABSTRACT

A method of improving contact resistance in a multi-layer heterostructure comprising the steps of providing a substrate, growing a crystalline material on the substrate, and doping close to an interface of the substrate and the crystalline material with n-silicon to provide continuity at the interface.

14 Claims, 1 Drawing Sheet

OHMIC CONTACT AND METHOD OF MANUFACTURE

FIELD OF THE INVENTION

This invention relates generally to the field of contacts and, more particularly, to an ohmic contact and methods of manufacture.

BACKGROUND OF THE INVENTION

Traditionally, AuGeNi ohmic contacts are used for GaAs based FETs and HEMTs. This requires annealing the device after contacts to temperatures greater than 300–400° C. Non-alloyed ohmic contacts to gallium arsenide (GaAs) have been demonstrated in the past by growing indium gallium arsenide (InGaAs) on GaAs and utilizing the contact to indium arsenide (InAs) to achieve low resistance. In the past the only way to achieve low contact resistance has been to grade the contact layer with $In_{(1-x)}Ga_xAs$, where X varies from 1 to 0, i.e. the layer varies from GaAs to InAs. The problem is that this graded growth introduces substantial complexity in the growth process and is not suitable for selectively grown contacts.

Accordingly, it would be highly desirable to provide improved fabrication methods for ohmic contacts.

It is a purpose of the present invention to provide improved fabrication methods for multi-layer heterostructures.

It is another purpose of the present invention to decrease contact resistance in a multi-layer heterostructure.

It is still another purpose of the present invention to provide a new and improved method of providing continuity at a crystalline/substrate interface of an ohmic contact.

It is a further purpose of the present invention to provide a new and improved fabrication method for non-alloyed ohmic contacts.

SUMMARY OF THE INVENTION

The above problems and others are at least partially solved and the above purposes and others are realized in a method of fabricating an ohmic contact and of providing substantial continuity at a crystalline material/substrate interface. The method is generally comprised of the steps of providing a substrate, growing a crystalline material on the substrate and delta doping close to an interface of the substrate and the crystalline material with n-silicon to provide substantial continuity at the interface.

BRIEF DESCRIPTION OF THE DRAWINGS

The foregoing and further and more specific objects and advantages of the instant invention will become readily apparent to those skilled in the art from the following detailed description thereof taken in conjunction with the drawings in which.

DESCRIPTION OF THE PREFERRED EMBODIMENT

The present invention provides, among other things, an ohmic contact, a method of fabricating an ohmic contact, a method of improving contact resistance in a multi-layer heterostructure, and a method of introducing continuity at an interface of indium arsenide and gallium arsenide in an ohmic contact. The present invention is easy to implement, efficient and exemplary for facilitating good contact resistance to allow electron tunneling.

Figure 1:
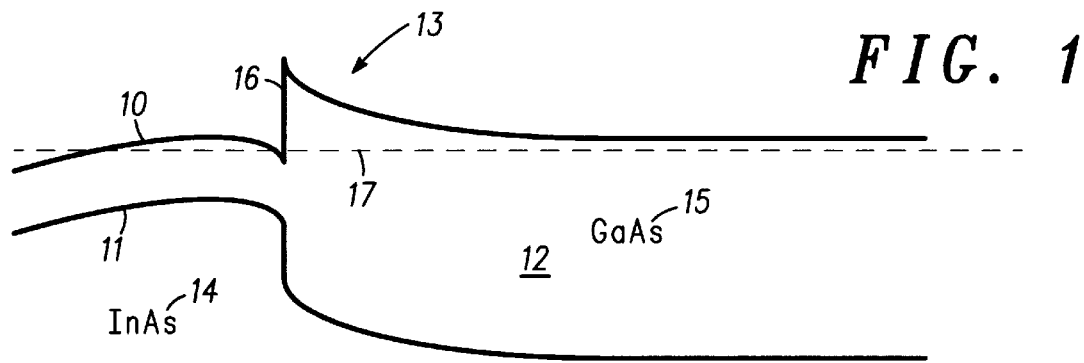
FIG. 1 illustrates an energy band diagram at a normal interface of indium arsenide and gallium arsenide.

Referring now to the drawings, FIG. 1 illustrates an energy band diagram, including a conduction band 10 and valence band 11, of a structure 12 with an interface 13 of an indium arsenide (InAs) layer 14 and a gallium arsenide (GaAs) substrate 15. Further shown is a barrier 16 for carriers at interface 13. Barrier 16 prevents good ohmic contact at interface 13 thus inhibiting tunneling along path 17 traversing barrier 16 from InAs 14 to GaAs 15, an anomaly commonly referred to be a result of Fermi level pinning. For the purposes of orientation, path 17 substantially defines the Fermi level.

Figure 2:
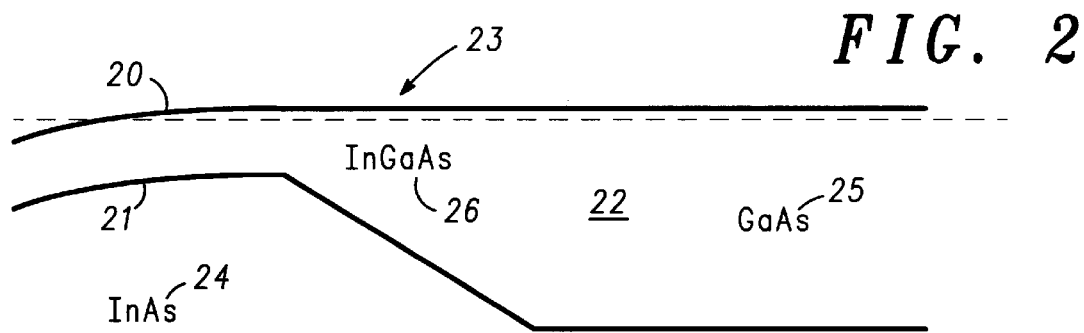
FIG. 2 illustrates an energy band diagram at an interface of indium arsenide changed gradually to gallium arsenide using indium gallium arsenide.

To overcome the poor ohmic contact exhibited by structure 12, FIG. 2 illustrates an energy band diagram, including a conduction band 20 and a valence band 21, of a structure 22 with an interface 23 of an InAs layer 24 and a GaAs substrate 25 using indium gallium arsenide (InGaAs) 26. By gradually changing GaAs 25 to InAs 24 using InGaAs 26 to form gradual interface 23 as shown, good ohmic contact is achieved. However, gradually changing InAs layer 24 to GaAs layer 25 using graded InGaAs 26 not only results in a poor structure 22 as shown in FIG. 2, it is very difficult to carry out particularly while growing selective material where the selective growth conditions are a function of the crystalline material composition.

Figure 3:
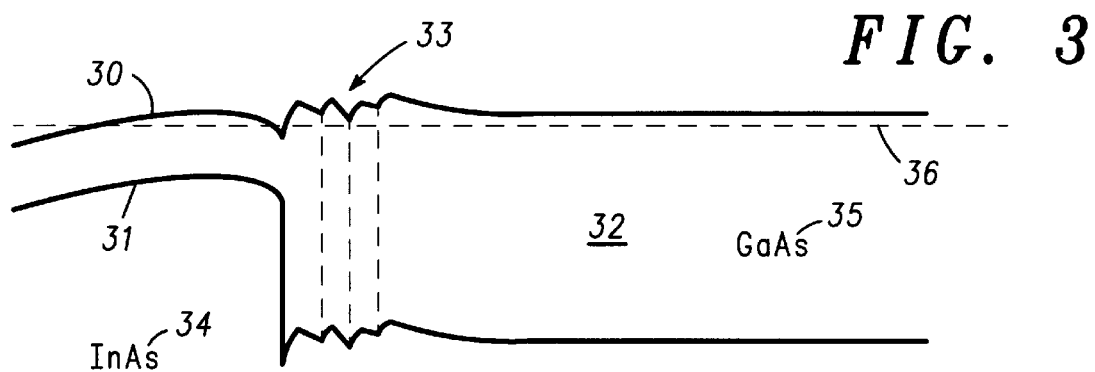
FIG. 3 illustrates an energy band diagram at a silicon doped interface of indium arsenide and gallium arsenide, in accordance with the present invention.

To avoid having to grow selectively graded contact or interface regions as shown in FIG. 2, the barrier obtained at the InAs/GaAs interface 13 as shown in FIG. 1 has to be avoided. In this vein, FIG. 3 illustrates an energy band diagram, including a conduction band 30 and a valence band 31, of a structure 32 with a multiple silicon delta doped interface 33 of an InAs layer 34 and a GaAs substrate 35, in accordance with the present invention. In the present example, although InAs layer 34 and GaAs layer 35 may be heavily doped with n-silicon, delta doping very close to interface 33 with n-silicon eliminates or otherwise substantially reduces the formation of a barrier and therefore eliminates Fermi level pinning thus providing for a good quality ohmic contact and wide continuity at interface 33. While a single delta doping close to interface 33 will reduce the barrier, generally a plurality of delta dopings, illustrated as notches 38 in FIG. 3, provide a more satisfactory interface match. The delta doping farthest from interface 33 will generally be within approximately 1000 Å from interface 33, since delta dopings farther than that have little effect, and the delta doping nearest to interface 33 will generally be within approximately 20 Å to 30 Å from interface 33. As a general rule, the delta doping closest to interface 33 should be as close as possible without being exposed by subsequent process steps, e.g. the formation of layer 34.

This allows electron tunneling along path 36 defining the Fermi level traversing interface 33 from InAs layer 34 to GaAs layer 35. Furthermore, with high delta doping of n-silicon close to interface 33, current conduction is possible in both directions enabling the use of InAs for the source and drain region of a field effect transistor device. Structure 32, operative as a non-alloyed ohmic contact, can be used to make single step metalization processes for forming, in addition, a gate contact to the GaAs devices.

In summary, multiple delta-doped n-silicon close to interface 33 of InAs layer 34 and GaAs layer 35 provides for wide continuity at interface 33 and prevents formation of a wide barrier at the pinned GaAs/InAs interface thus allowing tunneling due to an effective decrease in barrier height and a narrowing of the depletion region. With this technique, very good contact resistance 3–4 E-7 ohm-cm$^2$ is possible, Fermi level pinning at the interface is substantially eliminated, the formation of non-alloyed ohmic contacts is possible, and the process can easily be incorporated in epitaxial growth, such as by molecular/chemical beam epitaxy, while eliminating the need to grow compositionally graded InGaAs. Furthermore, although the specific details of delta doping n-silicon have not been herein discussed in great detail, such doping techniques and details are disclosed in exemplary detail in *Si Atomic-Planar-Doping in GaAs Made by Molecular Beam Epitaxy,* JAPANESE JOURNAL OF APPLIED PHYSICS, Vol. 24, No. 8, August, 1985, pp. L602–L604, of which is incorporated herein by reference.

The present invention has been described above with reference to a preferred embodiment. However, those skilled in the art will recognize that changes and modifications may be made in the described embodiments without departing from the nature and scope of the present invention. Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A method of improving contact resistance in a multi-layer heterostructure, the method comprising the steps of:

providing a substrate;

growing a crystalline material on the substrate; and doping close to an interface of the substrate and the crystalline material with n-silicon to provide substantial continuity at the interface.

2. The method of claim 1, wherein the step of providing a substrate further includes the step of providing a gallium arsenide substrate.

3. The method of claim 2, wherein the step of growing a crystalline material further includes the step of growing indium arsenide.

4. The method of claim 3, wherein the step of growing the indium arsenide further includes the step of epitaxially growing indium arsenide.

5. The method of claim 1, wherein the step of doping further includes the step of delta-doping.

6. The method of claim 1, wherein the step of doping further includes the step of epitaxially doping.

7. The method of claim 5, wherein the step of delta-doping further includes the step of epitaxially delta-doping.

8. A method of fabricating an ohmic contact, the method comprising the steps of:

providing a substrate;

defining an interface on a surface of the substrate;

selectively growing a crystalline material on the interface; and doping close to the interface with n-silicon.

9. The method of claim 8, wherein the step of providing a substrate further includes the step of providing a gallium arsenide substrate.

10. The method of claim 9, wherein the step of growing a crystalline material further includes the step of growing indium arsenide.

11. The method of claim 10, wherein the step of growing the indium arsenide further includes the step of epitaxially growing indium arsenide.

12. The method of claim 8, wherein the step of doping further includes the step of delta-doping.

13. The method of claim 8, wherein the step of doping further includes the step of epitaxially doping.

14. The method of claim 12, wherein the step of delta-doping further includes the step of epitaxially delta-doping.

* * * * *